(12) United States Patent
Lin et al.

(10) Patent No.: US 9,935,071 B1
(45) Date of Patent: Apr. 3, 2018

(54) SEMICONDUCTOR PACKAGE WITH LATERAL BUMP STRUCTURE

(71) Applicant: NANYA TECHNOLOGY CORPORATION, Taoyuan (TW)

(72) Inventors: Po-Chun Lin, Changhua (TW); Chin-Lung Chu, Taoyuan (TW)

(73) Assignee: NANYA TECHNOLOGY CORPORATION, Taoyuan (TW)

(*) Notice: Subject to any disclaimer, the term of this patent is extended or adjusted under 35 U.S.C. 154(b) by 0 days.

(21) Appl. No.: 15/410,246

(22) Filed: Jan. 19, 2017

(51) Int. Cl.
| H01L 23/48 | (2006.01) |
| H01L 23/552 | (2006.01) |
| H01L 23/00 | (2006.01) |
| H01L 23/31 | (2006.01) |
| H01L 21/56 | (2006.01) |

(52) U.S. Cl.
CPC ............ *H01L 24/14* (2013.01); *H01L 21/565* (2013.01); *H01L 23/3114* (2013.01); *H01L 24/11* (2013.01); *H01L 24/13* (2013.01); *H01L 24/16* (2013.01); *H01L 2224/1132* (2013.01); *H01L 2224/11849* (2013.01); *H01L 2224/13026* (2013.01); *H01L 2224/1418* (2013.01); *H01L 2224/16137* (2013.01)

(58) Field of Classification Search
CPC . H01L 23/552; H01L 23/48; H01L 23/59803; H01L 23/49848; H01L 24/48; H01L 2224/48091; H01L 2224/48247; H01L 24/14; H01L 24/13; H01L 24/16; H01L 23/3114; H01L 24/11; H01L 21/565; H01L 2224/13026; H01L 2224/1418; H01L 2224/16137; H01L 2224/1132; H01L 2224/11849
USPC ........ 257/737, 734, 738, 778, 686, 685, 723, 257/777, 786, 784, 684
See application file for complete search history.

(56) References Cited

U.S. PATENT DOCUMENTS

| 7,030,474 B1* | 4/2006 | Glenn | H01L 23/3107 257/666 |
| 7,071,541 B1* | 7/2006 | Glenn | H01L 23/49503 257/666 |
| 8,063,474 B2 | 11/2011 | Liu et al. | |
| 2009/0184418 A1* | 7/2009 | Hwang | H01L 23/49838 257/737 |
| 2012/0228750 A1* | 9/2012 | Okumura | H01L 21/6836 257/659 |
| 2015/0270205 A1* | 9/2015 | Tollafield | B23K 1/0016 257/675 |

\* cited by examiner

*Primary Examiner* — Alexander O Williams
(74) *Attorney, Agent, or Firm* — Muncy, Geissler, Olds & Lowe, P.C.

(57) ABSTRACT

A semiconductor package includes a semiconductor device having an upper surface and a side, wherein the upper surface and the side form a corner of the semiconductor device. The semiconductor package also includes a lateral bump structure disposed on the side and implementing a lateral signal path of the semiconductor device. The semiconductor package further includes a vertical bump structure disposed over the upper surface and implementing a vertical signal path of the semiconductor device.

10 Claims, 11 Drawing Sheets

SEMICONDUCTOR PACKAGE WITH LATERAL BUMP STRUCTURE

TECHNICAL FIELD

The present disclosure relates to a semiconductor package and a method for preparing the same, and particularly relates to a semiconductor package having a lateral bump structure implementing a lateral signal path between two laterally adjacent devices and a method for preparing the same.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip is technique is now widely used for manufacturing semiconductor devices. Numerous manufacturing steps are undertaken in the production of such semiconductor packages.

Accordingly, the manufacturing of semiconductor devices in a miniaturized scale is becoming more complicated. An increase in the complexity of manufacturing semiconductor devices may cause deficiencies such as poor electrical interconnection, development of cracks, or delamination of components. As such, there are many challenges to be overcome when modifying the structure and manufacture of semiconductor devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor package comprising a semiconductor device having an upper surface and a side, wherein the upper surface and the side form a corner of the semiconductor device; and a lateral bump structure disposed on the side and implementing a lateral signal path of the semiconductor device.

In some embodiments, the semiconductor package further comprises a vertical bump structure disposed over the upper surface and implementing a vertical signal path of the semiconductor device, wherein the vertical bump structure is separated from the lateral bump structure.

In some embodiments, the lateral bump structure extends laterally from the side.

In some embodiments, the vertical bump structure extends vertically from the upper surface.

In some embodiments, the semiconductor package further comprises a contact pad disposed between the side and the lateral bump structure.

Another aspect of the present disclosure provides a semiconductor package, comprising: a first semiconductor device having a first upper surface and a first side, wherein the first upper surface and the first side form a first corner of the first semiconductor device; a second semiconductor device laterally adjacent to the first semiconductor device, wherein the second semiconductor device comprises a second upper surface and a second side, and the second upper surface and the second side form a second corner of the second semiconductor device; and a lateral bump structure extending from the first side to the second side and implementing a lateral signal path between the first semiconductor device and the second semiconductor device.

In some embodiments, the semiconductor package further comprises: a molding member surrounding the first semiconductor device and the second semiconductor device, wherein an intervening portion of the molding member is disposed between the first semiconductor device and the second semiconductor device; wherein the lateral bump structure extends laterally across the intervening portion.

In some embodiments, the semiconductor package further comprises a first bump structure disposed over the first upper surface, wherein the first vertical bump structure is separated from the lateral bump structure.

In some embodiments, the semiconductor package further comprises a second bump structure disposed over the second upper surface, wherein the second vertical bump structure is separated from the lateral bump structure.

In some embodiments, the lateral bump structure extends vertically across the first upper surface and the second upper surface.

In some embodiments, the semiconductor package further comprises a contact pad disposed between the first side and the lateral bump structure.

Another aspect of the present disclosure provides a method for preparing a semiconductor package, comprising: providing a semiconductor device having a bulk region and an edge region adjacent to the bulk region; forming a depression in the edge region, wherein the depression exposes a side of the bulk region; and forming a lateral bump structure in the depression, wherein the lateral bump structure is formed on the side and implements a lateral signal path of the semiconductor device.

In some embodiments, the method for preparing a semiconductor package comprises: forming a mask over an upper surface of the semiconductor device, wherein the mask has an aperture exposing a portion of the edge region; and performing an etching process to remove a portion of the edge region exposed by the aperture to form the depression.

In some embodiments, the method for preparing a semiconductor package comprises: forming a bumping material in the depression; removing the mask; and performing a thermal process to form the lateral bump structure.

In some embodiments, the method for preparing a semiconductor package further comprises performing an etching process to increase a depth of the depression before the thermal process.

In some embodiments, the method for preparing a semiconductor package further comprises performing a grinding process from a bottom surface of the semiconductor device to remove the edge region of the semiconductor device after the thermal process.

In some embodiments, the method for preparing a semiconductor package comprises forming a mask over an upper surface of the semiconductor device, wherein the mask has an opening exposing a portion of the bulk region.

In some embodiments, the method for preparing a semiconductor package further comprises: forming a bumping material in the opening; removing the mask; and performing a thermal process to form a vertical bump structure on the bulk region.

In some embodiments, the method for preparing a semiconductor package further comprises forming a vertical bump structure over an upper surface of the semiconductor device and implementing a vertical signal path of the semiconductor device.

In some embodiments, the method for preparing a semiconductor package integrally forms the vertical bump structure with the lateral bump structure.

The embodiments of the present disclosure provide a semiconductor package with a lateral bump structure implementing the lateral signal path between the two laterally adjacent semiconductor devices in the absence of a redistribution structure. Consequently, the height of the semiconductor package of the present disclosure is less than the height of the semiconductor package with a redistribution structure. In other words, the semiconductor package of the present disclosure can meet the miniaturized scale demand (small form factor) of the semiconductor packages. In addition, the absence of the redistribution structure is a key factor in the reduction of the fabrication cost of the semiconductor package.

The lateral extension of the lateral bump structure from the side of the semiconductor device can contact a corresponding conductor of a laterally adjacent device to implement a lateral signal path between the semiconductor device and the laterally adjacent device in the absence of a redistribution structure corresponding to the redistribution layer.

The foregoing has outlined rather broadly the features and technical advantages of the present disclosure in order that the detailed to description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor package having a lateral bump structure implementing a lateral signal path between two laterally adjacent devices and a method for preparing the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
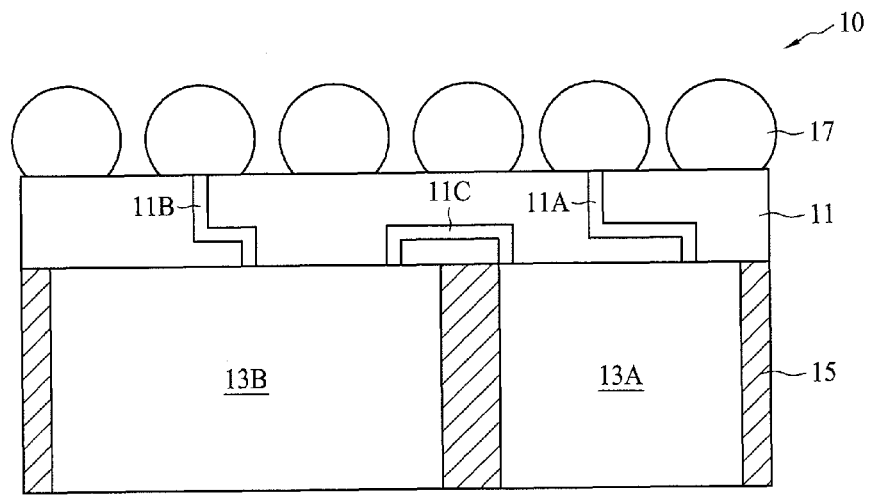
FIG. 1 is a cross-sectional view of a semiconductor package in accordance with a comparative embodiment of the present disclosure.

FIG. 1 is a cross-sectional view of a semiconductor package 10 in accordance with a comparative embodiment of the present disclosure. The semiconductor package 10 includes a redistribution layer 11, a semiconductor chip 13A and a semiconductor chip 13B disposed on the redistribution layer 11, a molding member 15 encapsulating the semiconductor chip 13A and the semiconductor chip 13B on the redistribution layer 11, and a plurality of conductive bumps 17 disposed on the redistribution layer 11. In some embodiments, the conductive bumps 17 are disposed on the upper side of the redistribution layer 11, while the semiconductor chip 13A and the semiconductor chip 13B are disposed on the bottom side of the redistribution layer 11.

In some embodiments, a vertical signal path of the semiconductor chip 13A is implemented by a conductive line 11A in the redistribution layer 11 and one of the conductive bumps 17, a vertical signal path of the semiconductor chip 13B is implemented by a conductive line 11B in the redistribution layer 11 and one of the conductive bumps 17, and a lateral signal path between the semiconductor chip 13A and the semiconductor chip 13B is implemented by a conductive line 11C in the redistribution layer 11 in the absence of the conductive bumps 17.

Figure 2:
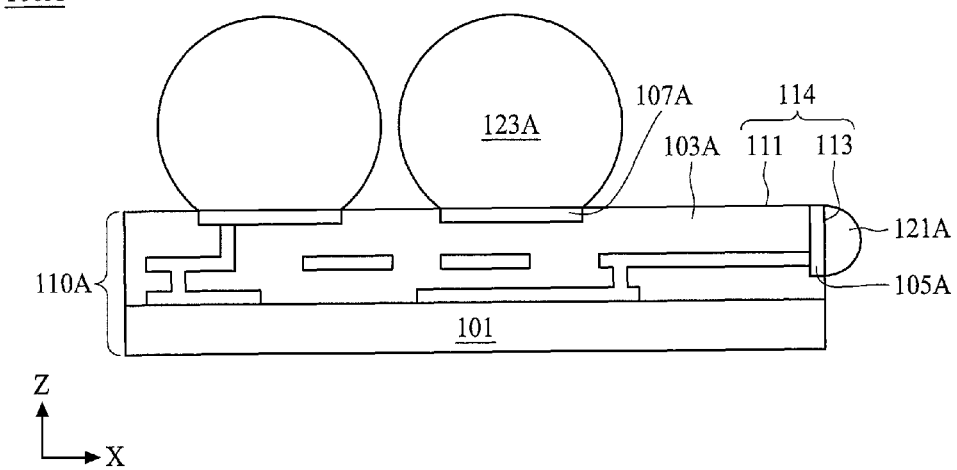
FIG. 2 is a cross-sectional view of a semiconductor package in accordance with some embodiments of the present disclosure.

FIG. 2 is a cross-sectional view of a semiconductor package 100A in accordance with some embodiments of the present disclosure. In some embodiments, the semiconductor package 100A comprises a semiconductor device 110A having an upper surface 111 and a side 113, a lateral bump structure 121A disposed on the side 113, and a vertical bump structure 123A disposed over the upper surface 111. In some embodiments, the upper surface 111 and the side 113 form a corner 114 of the semiconductor device 110A. In some embodiments, the first side 113 is substantially perpendicular to the first upper surface 111.

In some embodiments, the lateral bump structure 121A extends laterally along the lateral direction (X-direction in the drawing) from the side 113 of the semiconductor device 110A and implements a lateral signal path of the semiconductor device 110A. In some embodiments, the vertical bump structure 123A extends vertically along the vertical direction (Z-direction in the drawing) from the upper surface 111 of the semiconductor device 110A and implements a vertical signal path of the semiconductor device 110A. In some embodiments, the vertical bump structure 123A is separated from the lateral bump structure 121A.

In some embodiments, the semiconductor package 100A comprises a semiconductor substrate 101 and an electrical interconnect 103A; the semiconductor substrate 101 can be a silicon substrate, a semiconductor-on-insulator (SOI) substrate, or any construction comprising semiconductor materials; and the electrical interconnect 103A comprises dielectric material and conductive elements made of, for example, Ti, Al, Ni, nickel vanadium (NiV), Cu, or a Cu alloy. In some embodiments, the semiconductor package 100A includes integrated circuits (IC) or semiconductor components such as transistors, capacitors, resistors, diodes, photo-diodes, fuses, and the like configured to perform one or more functions, wherein the IC and semiconductor components are not shown for clarity in this illustration.

In some embodiments, the electrical interconnect 103A of the semiconductor package 100A comprises a lateral conductive contact pad 105A, and the lateral bump structure 121A is disposed on the lateral conductive contact pad 105A. In some embodiments, the electrical interconnect 103A of the semiconductor package 100A comprises a conductive contact pad 107A, and the vertical bump structure 123A is disposed on the conductive contact pad 107A. In some embodiments, the lateral conductive contact pad 105A and the conductive contact pad 107A are made of aluminum (Al), copper (Cu), tin (Sn), nickel (Ni), gold (Au), silver (Ag), or other electrically conductive materials.

In some embodiments, the lateral extension of the lateral bump structure 121A from the side 113 of the semiconductor device 110A can be used to contact a corresponding conductor of a laterally adjacent device to implement the lateral signal path between the semiconductor device 110A and the laterally adjacent device in the absence of a redistribution structure corresponding to the redistribution layer 11 shown in FIG. 1.

Figure 3:
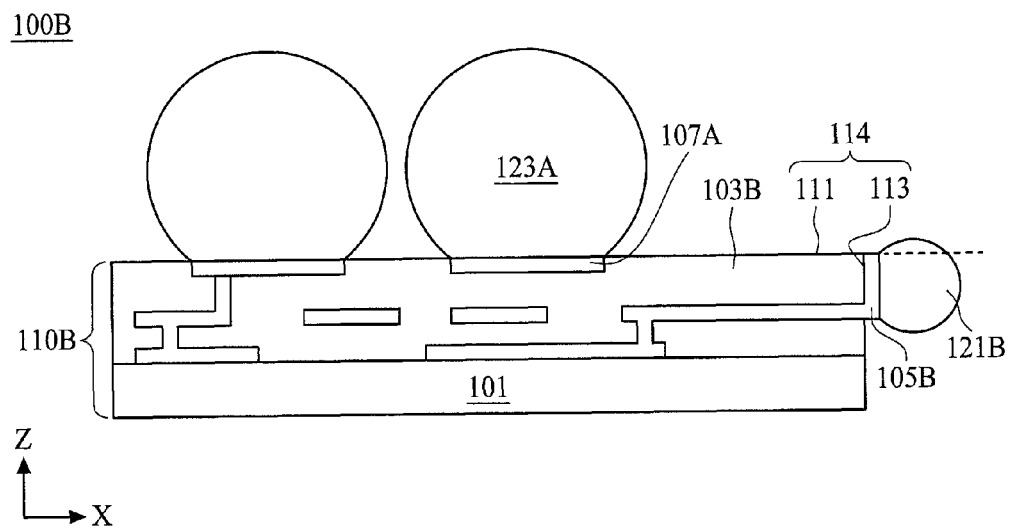
FIG. 3 is a cross-sectional view of a semiconductor package in accordance with some embodiments of the present disclosure.

FIG. 3 is a cross-sectional view of a semiconductor package 100B in accordance with some embodiments of the present disclosure. The semiconductor package 100B shown in FIG. 3 is substantially the same as the semiconductor package 100A shown in FIG. 2, except for differences in the position of the lateral conductive contact pad and the lateral bump structure. In FIG. 2, the lateral conductive contact pad 105A of the semiconductor device 110A is embedded on the left of the side 113, whereas in FIG. 3, the conductive contact pad 105B of the semiconductor device 110B is implemented by conductive elements of the electrical interconnect 103B and disposed on the right of the side 113. In some embodiments, the lateral bump structure 121B of the semiconductor device 110B extends vertically across the upper surface 111, as shown in FIG. 3.

Figure 4:
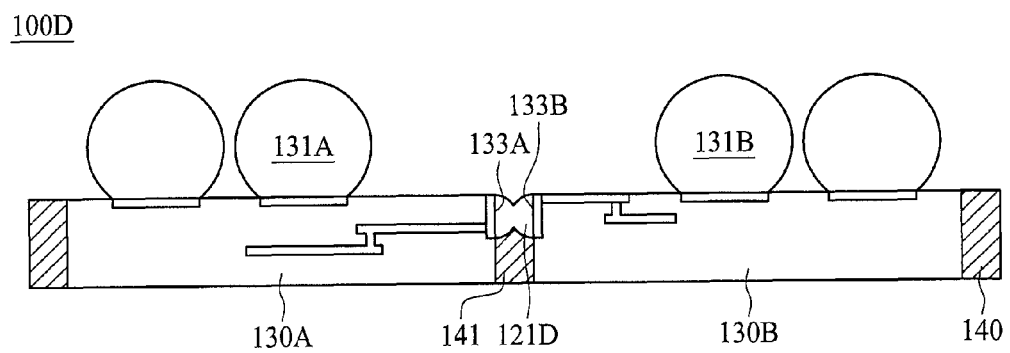
FIG. 4 is a cross-sectional view of a semiconductor package in accordance with some embodiments of the present disclosure.

FIG. 4 is a cross-sectional view of a semiconductor package 100D in accordance with some embodiments of the present disclosure. In some embodiments, the semiconductor package 100D comprises: a first semiconductor device 130A; a second semiconductor device 130B laterally adjacent to the first semiconductor device 130A; a molding member 140 encapsulating the first semiconductor device 130A and the second semiconductor device 130B; and a lateral bump structure 121D implementing a lateral signal path between the first semiconductor device 130A and the second semiconductor device 130B. In some embodiments, the first semiconductor device 130A and the second semiconductor device 130B may be the semiconductor device 110A shown in FIG. 2 or the semiconductor device 110B shown in FIG. 3.

In some embodiments, the lateral bump structure 121D extends laterally from one side 133A of the first semiconductor device 130A to one side 133B of the second semiconductor device 130B, and the side 133A faces the side 133B. In some embodiments, an intervening portion 141 of the molding member 140 is disposed between the first semiconductor device 130A and the second semiconductor device 130B, and the lateral bump structure 121D extends laterally across the intervening portion 141 of the molding member 140.

In some embodiments, the first semiconductor device 130A and the second semiconductor device 130B are two adjacent chips of a single wafer. In some embodiments, the first semiconductor device 130A and the second semiconductor device 130B are two chips from different wafers. In some embodiments, the semiconductor package 100D further comprises a vertical bump structure 131A implementing a vertical signal path of the first semiconductor device 130A and a vertical bump structure 131B implementing a vertical signal path of the second semiconductor device 130B.

In some embodiments, the lateral bump structure 121D implements the lateral signal path between the first semiconductor device 130A and the second semiconductor device 130B in the absence of a redistribution structure corresponding to the redistribution layer 11 shown in FIG. 1. Consequently, the height of the semiconductor package 100D in FIG. 4 is less than the height of the semiconductor package 10 in FIG. 1. In other words, the semiconductor package 100D in FIG. 4 can meet the miniaturized scale demand (small form factor) of the semiconductor packages. In addition, the absence of a redistribution structure corresponding to the redistribution layer 11 shown in FIG. 1 is a key factor in the reduction of the fabrication cost of the semiconductor package 100D in FIG. 4.

Figure 5:
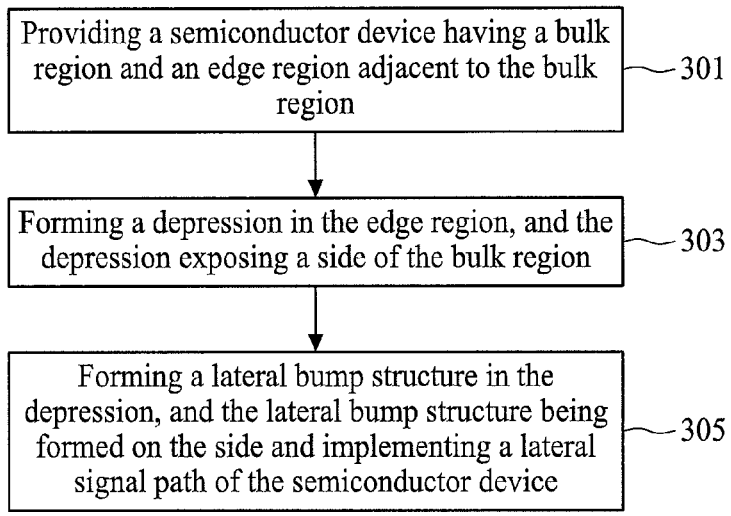
FIG. 5 is a flow chart of a method for preparing a semiconductor package in accordance with some embodiments of the present disclosure.

FIG. 5 is a flow chart of a method for preparing a semiconductor package in accordance with some embodiments of the present disclosure. In some embodiments, the semiconductor package can be formed by a method 300 of FIG. 5. The method 300 includes a number of operations and the description and illustration are not deemed as a limitation to the sequence of the operations. The method 300 includes a number of steps (301, 303, and 305).

Figure 6:
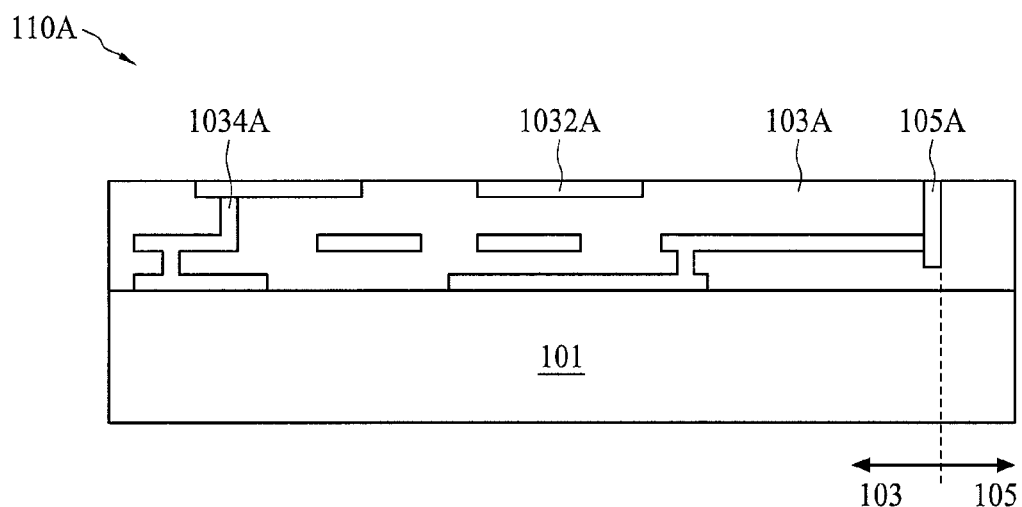
FIGS. 6 to 10 are schematic views of a process for preparing the semiconductor package by the method of FIG. 5 in accordance with some embodiments of the present disclosure.

FIGS. 6 to 10 are schematic views of a process for preparing the semiconductor package by the method of FIG. 5 in accordance with some embodiments of the present disclosure. In step 301, a semiconductor device 110A is provided as shown in FIG. 6. In some embodiments, the semiconductor device 110A comprises a semiconductor substrate 101 and an electrical interconnect 103A on the semiconductor substrate 101.

In some embodiments, the semiconductor device 110A has a bulk region 103 and an edge region 105 adjacent to the bulk region 103, several vertical conductive contact pads 1032A are formed in the bulk region 103 and electrically connected to conductive vias 1034A of the electrical interconnect 103A, and a lateral conductive contact pad 105A is formed in the bulk region 103 adjacent to the edge region 105 and electrically connected to the electrical interconnect 103A. In some embodiments, integrated circuits (IC) or semiconductor components such as transistors, capacitors, resistors, diodes, photo-diodes, fuses, and the like are formed in the bulk region 103.

Figure 7:
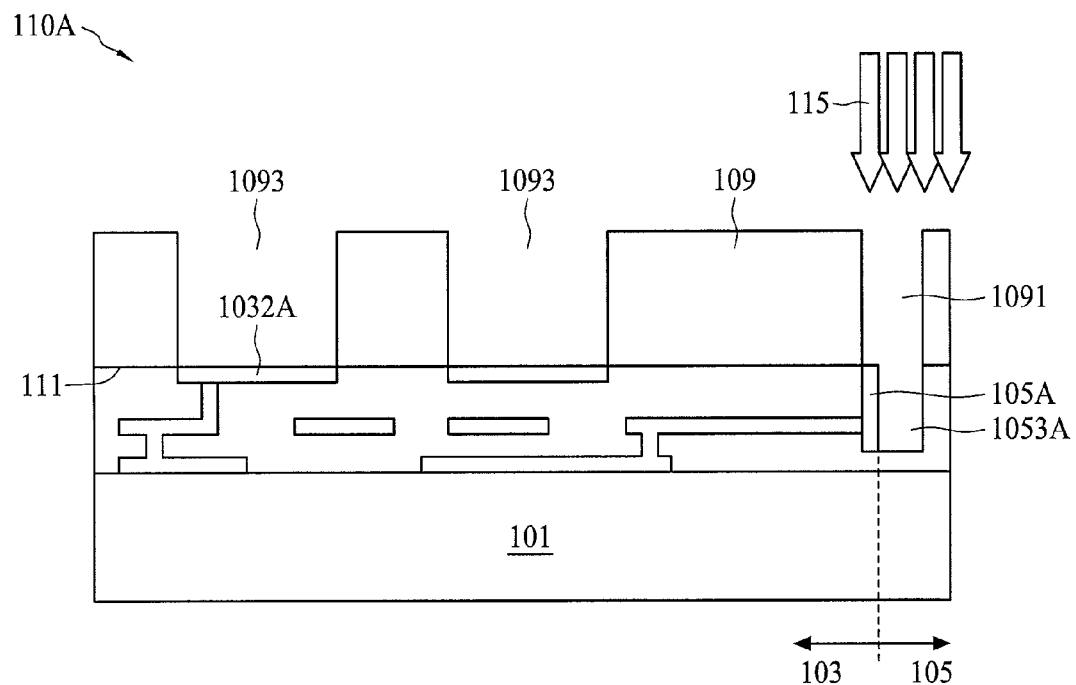

In step 303, a depression 1053A is formed in the edge region 105 of the semiconductor device 110A, as shown in FIG. 7. The preparation of the depression 1053A includes forming a mask 109 over an upper surface 111 of the semiconductor device 110A, wherein the mask 109 has an aperture 1091 exposing a portion of the edge region 105 and a plurality of openings 1093 exposing a portion of the bulk portion 103. Subsequently, an etching process such as a dry etching with etchant 115 is performed to remove a portion of the edge region 105 exposed by the aperture 1091 to form the depression 1053A. In some embodiments, the depression 1053A exposes the lateral conductive contact pad 105A, and the openings 1093 expose the vertical conductive contact pads 1032A.

Figure 8:
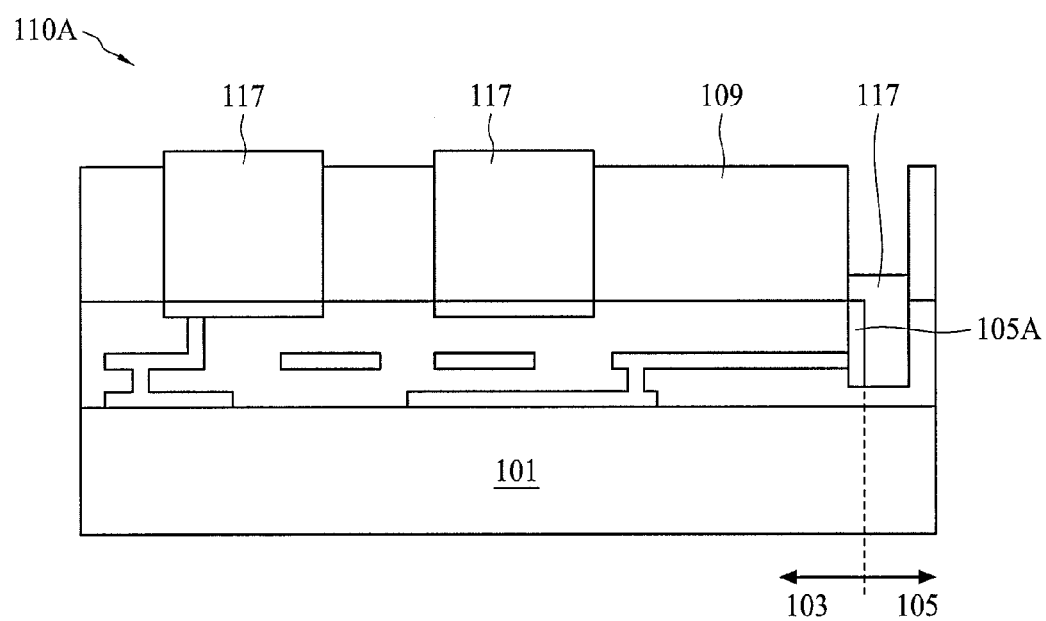
Figure 9:
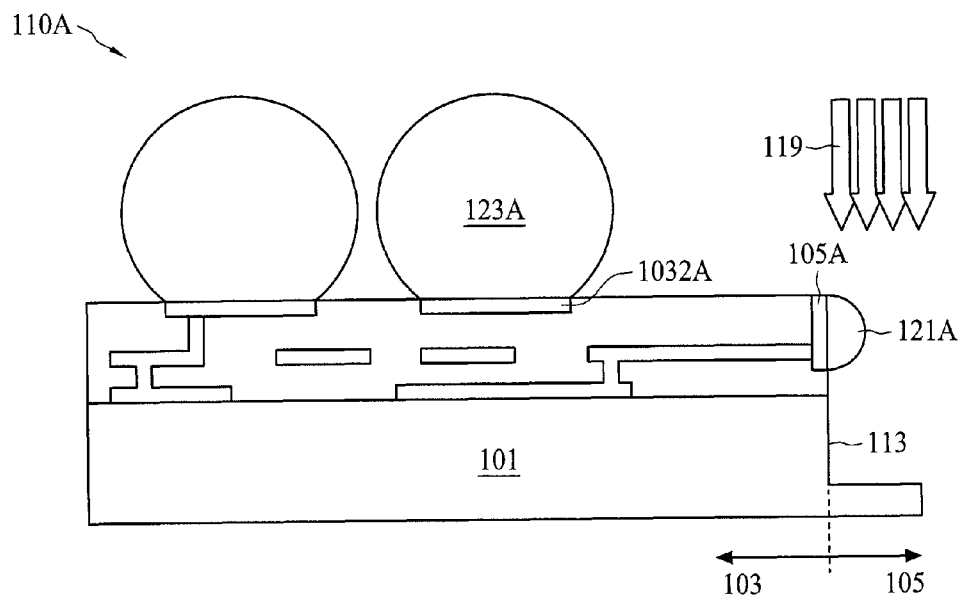
Figure 10:
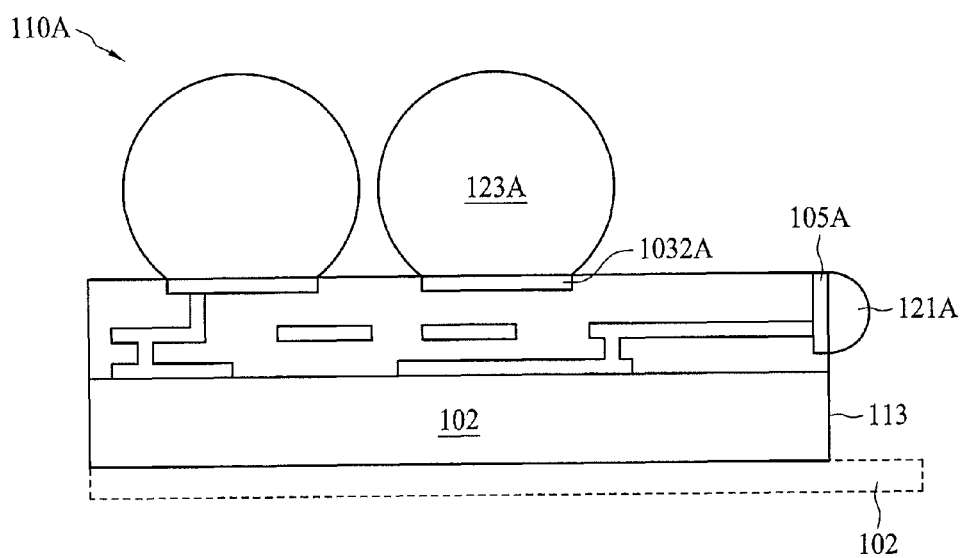

In step 305, a lateral bump structure 121A is formed in the depression 1053A, as shown in FIGS. 8-10. In FIG. 8, a bumping material 117 is formed in the depression 1053A and on the vertical conductive contact pads 1032A in the openings 1093. In some embodiments, the bumping material 117 includes lead-free solders, including tin, copper, and silver, or "SAC" compositions, and other eutectics that have a common melting point and form conductive solder connections in electrical applications.

In FIG. 9, the mask 109 is removed and a portion of the edge portion 105 is then removed, for example by an etching process with etchant 119. Subsequently, a thermal treating process such as an infrared (IR) reflow process is performed to integrally form the lateral bump structure 105A on the side 113 of the semiconductor device 110A and the vertical bump structure 123A over the vertical conductive contact pads 1032A on the semiconductor device 110A.

In FIG. 10, a grinding process is performed from a bottom surface of the semiconductor device 110A to remove a bottom portion 102 such that the edge region 105 of the semiconductor device 110A is completely removed after the thermal process. Consequently, the lateral bump structure 121A on the lateral conductive contact pad 105A can contact a contact pad of an adjacent device and implements a lateral signal path of the semiconductor device 110A and the adjacent device, while the vertical bump structure 123A on the vertical conductive contact pads 1032A implements a vertical signal path of the semiconductor device 110A.

Figure 11:
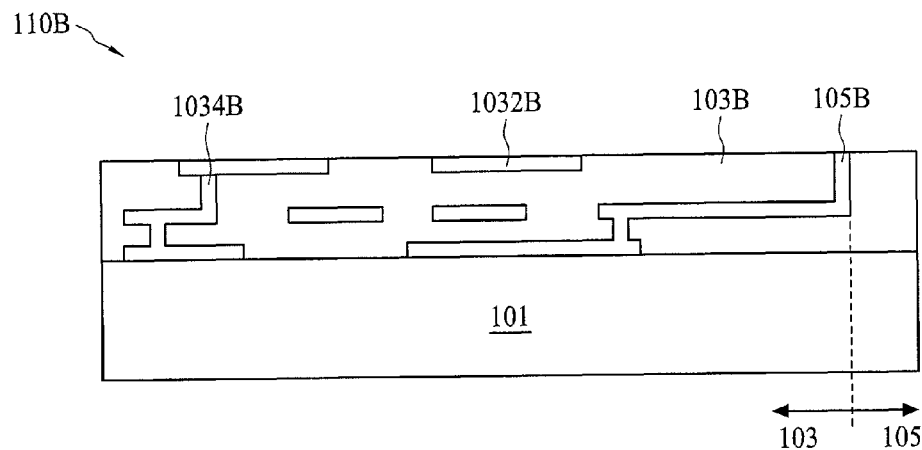
FIGS. 11 to 15 are schematic views of a process for preparing the semiconductor package by the method of FIG. 5 in accordance with some embodiments of the present disclosure.

FIGS. 11 to 15 are schematic views of a process for preparing the semiconductor package by the method of FIG. 5 in accordance with some embodiments of the present disclosure. In step 301, a semiconductor device 110B is provided as shown in FIG. 11. In some embodiments, the semiconductor device 110B comprises a semiconductor substrate 101 and an electrical interconnect 103B on the semiconductor substrate 101.

In some embodiments, the semiconductor device 110B has a bulk region 103 and an edge region 105 adjacent to the bulk region 103, and several vertical conductive contact pads 1032B are formed in the bulk region 103 and electrically connected to conductive vias 1034B of the electrical interconnect 103B; in addition, a lateral conductive contact pad 105B is implemented by conductive elements of the electrical interconnect 103B in the bulk region 103 adjacent to the edge region 105. In some embodiments, integrated circuits (IC) or semiconductor components such as transistors, capacitors, resistors, diodes, photo-diodes, fuses, and the like are formed in the bulk region 103.

Figure 12:
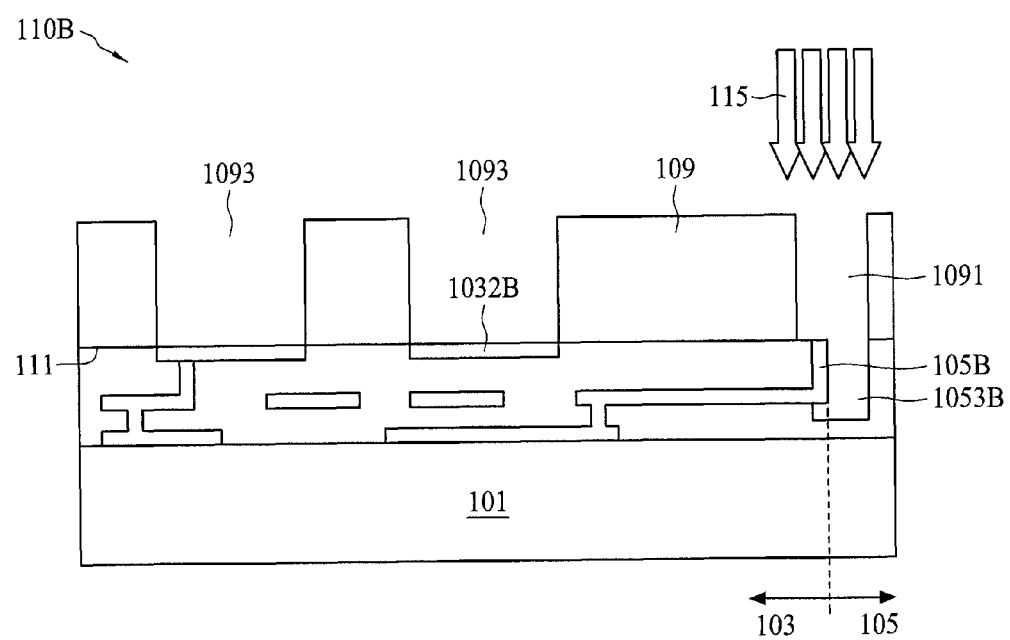

In step 303, a depression 1053B is formed in the edge region 105 of the semiconductor device 110B, as shown in FIG. 12. The preparation of the depression 1053B includes forming a mask 109 over an upper surface 111 of the semiconductor device 110B, wherein the mask 109 has an aperture 1091 exposing a portion of the edge region 105 and a plurality of openings 1093 exposing a portion of the bulk portion 103. Subsequently, an etching process such as a dry etching with etchant 115 is performed to remove a portion of the edge region 105 exposed by the aperture 1091 to form the depression 1053B. In some embodiments, the depression 1053B exposes the lateral conductive contact pad 105B, and the openings 1093 expose the vertical conductive contact pads 1032B.

Figure 13:
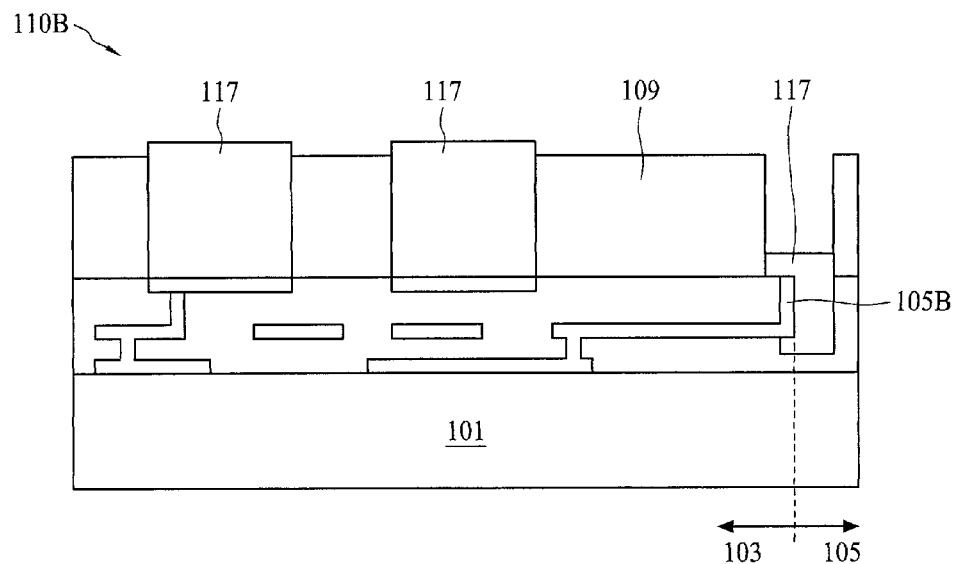
Figure 14:
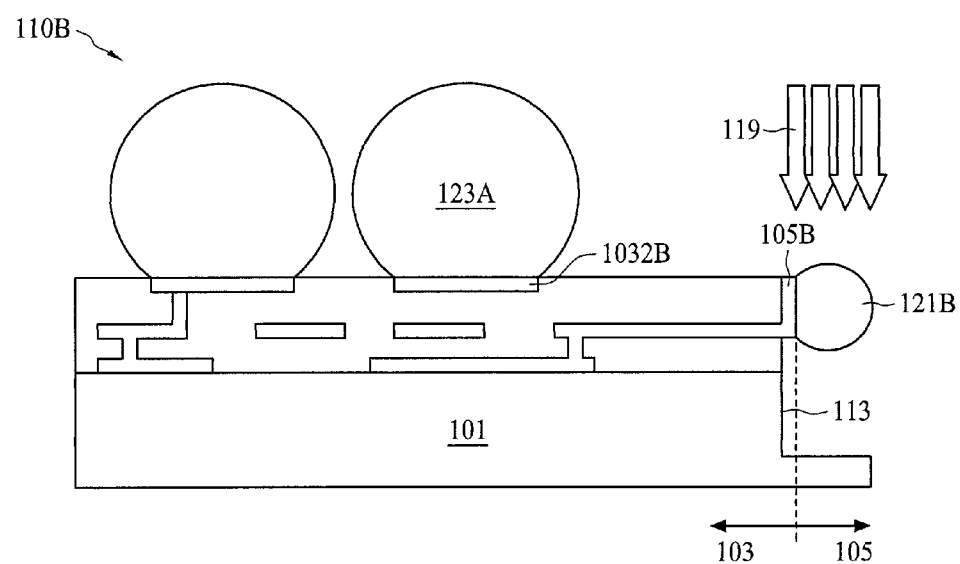
Figure 15:
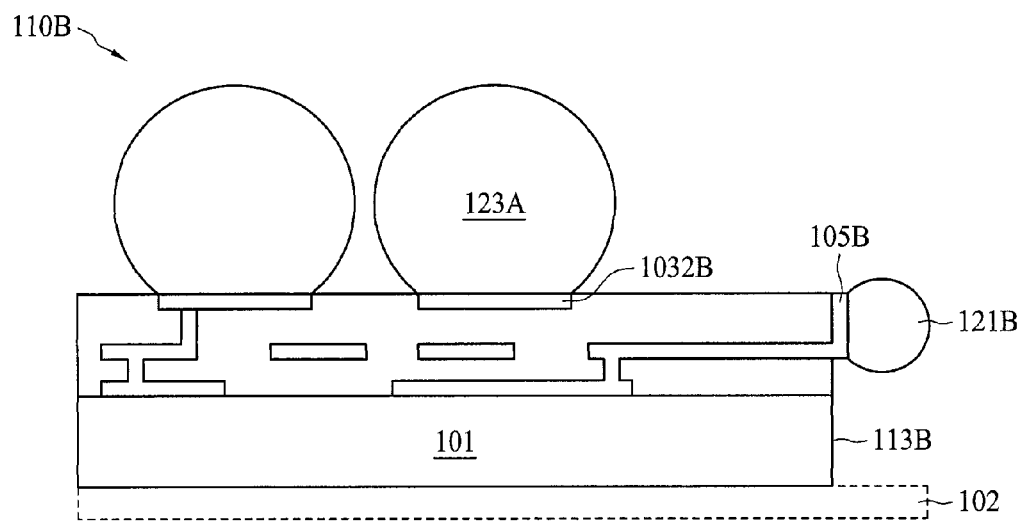

In step 305, a lateral bump structure 121B is formed in the depression 1053B, as shown in FIGS. 13-15. In FIG. 13, a bumping material 117 is formed in the depression 1053B and on the vertical conductive contact pads 1032B in the openings 113. In some embodiments, the bumping material 117 includes lead-free solders, including tin, copper, and silver, or "SAC" compositions, and other eutectics that have a common melting point and form conductive solder connections in electrical applications.

In FIG. 14, the mask 109 is removed and a portion of the edge portion 105 is then removed, for example by an etching process with etchant 119. Subsequently, a thermal treating process such as an infrared (IR) reflow process is performed to integrally form the lateral bump structure 121B on the side 113 of the semiconductor device 110B and the vertical bump structure 123A on the vertical conductive contact pads 1032B of the semiconductor device 110B.

In FIG. 15, a grinding process is performed from a bottom surface of the semiconductor device 110B to remove a bottom portion 102 such that the edge region 105 of the semiconductor device 110A is completely removed after the thermal process. Consequently, the lateral bump structure 121B on the lateral conductive contact pad 105B can contact a contact pad of an adjacent device and implements a lateral signal path of the semiconductor device 110B and the adjacent device, while the vertical bump structure 123A on the vertical conductive contact pads 1032B implement a vertical signal path of the semiconductor device 110B.

Figure 16:
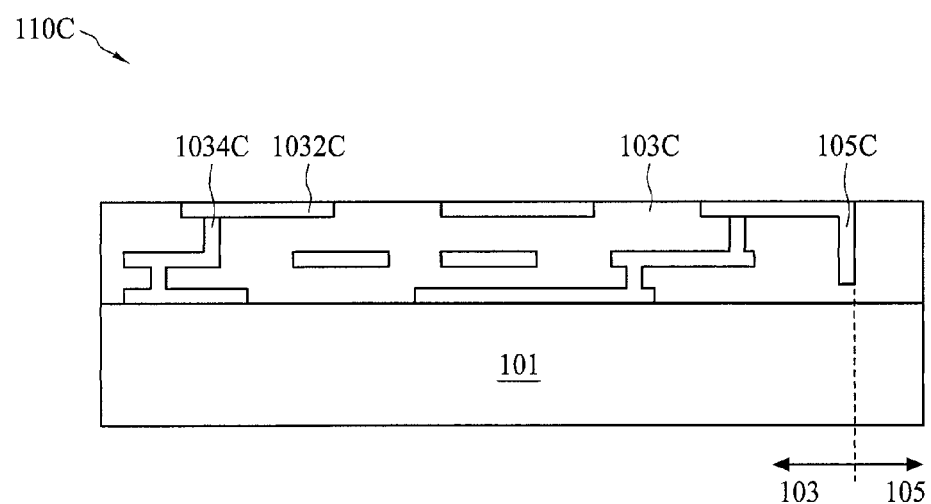
FIGS. 16 to 21 are schematic views of a process for preparing the semiconductor package by the method of FIG. 5 in accordance with some embodiments of the present disclosure.

FIGS. 16 to 20 are schematic views of a process for preparing the semiconductor package by the method of FIG. 5 in accordance with some embodiments of the present disclosure. In step 301, a semiconductor device 110C is provided as shown in FIG. 16. In some embodiments, the semiconductor device 110C comprises a semiconductor substrate 101 and an electrical interconnect 103C on the semiconductor substrate 101.

In some embodiments, the semiconductor device 110C has a bulk region 103 and an edge region 105 adjacent to the bulk region 103, and several vertical conductive contact pads 1032C are formed in the bulk region 103 and electrically connected to conductive vias 1034C of the electrical interconnect 103C; in addition, a lateral conductive contact pad 105C is formed in the bulk region 103 adjacent to the edge region 105 and electrically connected to the conductive vias 1034C of the electrical interconnect 103C. In some embodiments, integrated circuits (IC) or semiconductor components such as transistors, capacitors, resistors, diodes, photo-diodes, fuses, and the like are formed in the bulk region 103.

Figure 17:
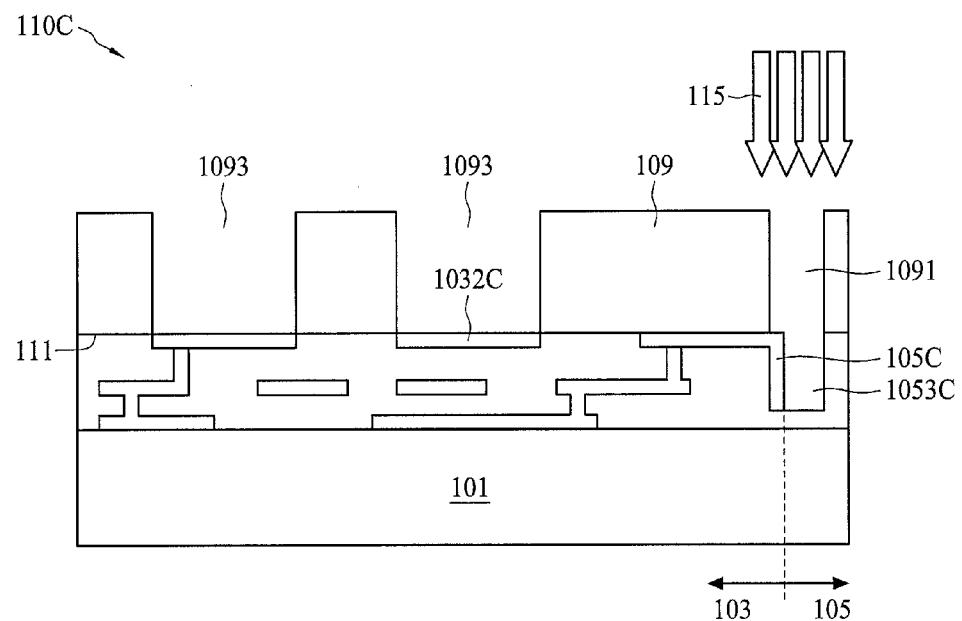

In step 303, a depression 1053C is formed in the edge region 105 of the semiconductor device 110C, as shown in FIG. 17. The preparation of the depression 1053C includes forming a mask 109 over an upper surface 111 of the semiconductor device 110C, wherein the mask 109 has an aperture 1091 exposing a portion of the edge region 105 and a plurality of openings 1093 exposing a portion of the bulk portion 103. Subsequently, an etching process such as a dry etching with etchant 115 is performed to remove a portion of the edge region 105 exposed by the aperture 1091 to form the depression 1053C. In some embodiments, the depression 1053C exposes the lateral conductive contact pad 105C, and the openings 1093 expose the vertical conductive contact pads 1032C.

Figure 18:
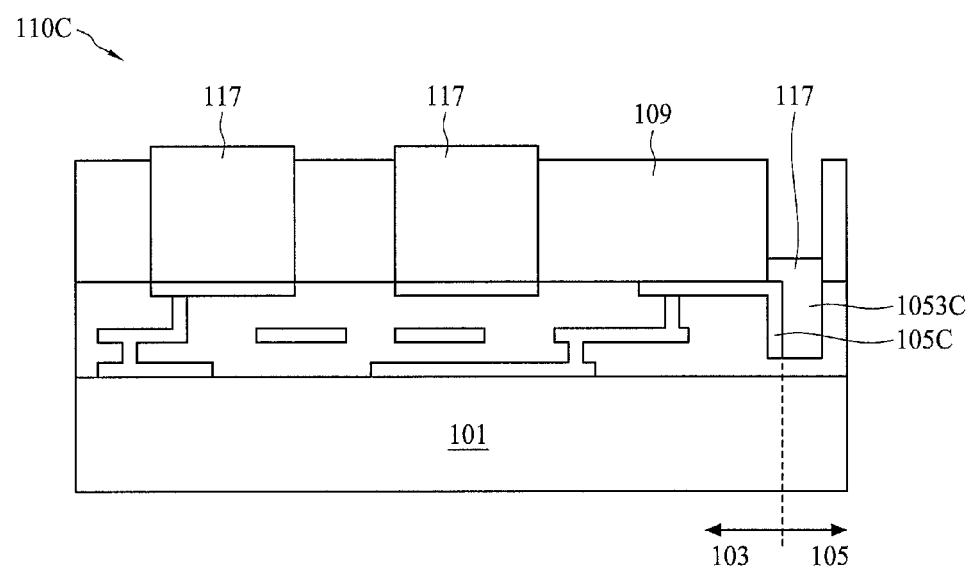
Figure 19:
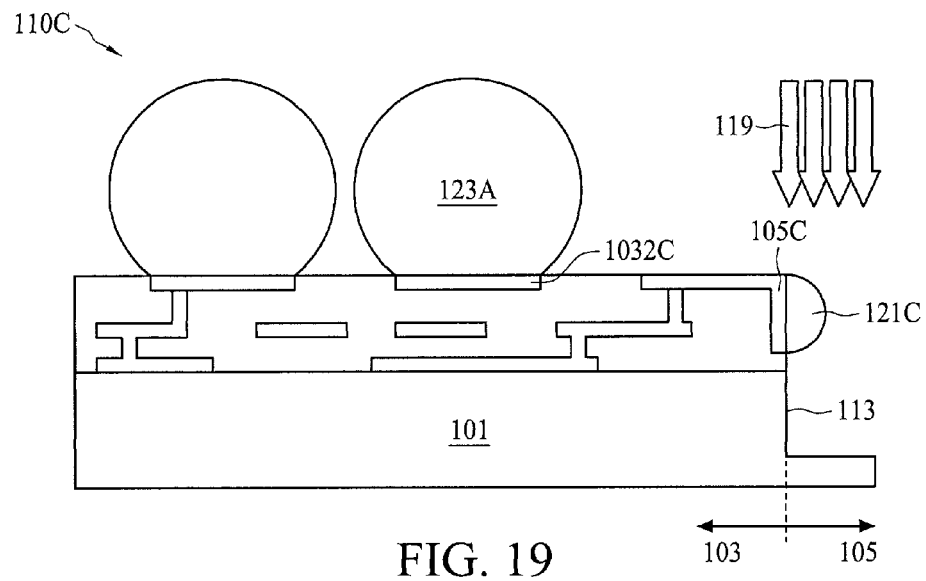
Figure 20:
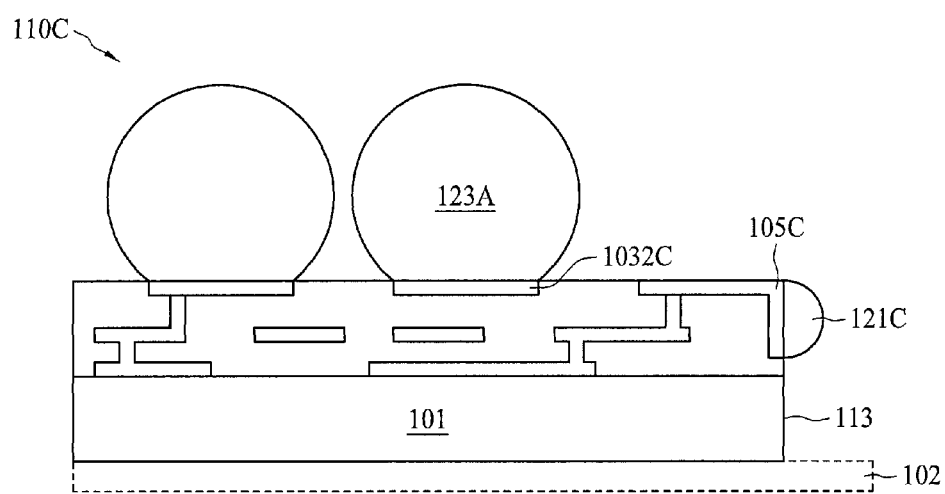

In step 305, a lateral bump structure 121C is formed in the depression 1053C, as shown in FIGS. 18-20. In FIG. 18, a bumping material 117 is formed in the depression 1053C and on the vertical conductive contact pads 1032C in the openings 1093. In some embodiments, the bumping material 117 includes lead-free solders, including tin, copper, and silver, or "SAC" compositions, and other eutectics that have a common melting point and form conductive solder connections in electrical applications.

In FIG. 19, the mask 109 is removed and a portion of the edge portion 105 is then removed, for example by an etching process with etchant 119. Subsequently, a thermal treating process such as an infrared (IR) reflow process is performed to integrally form the lateral bump structure 121C on the side 113 of the semiconductor device 110C and the vertical bump structure 123A on the vertical conductive contact pads 1032C of the semiconductor device 110C.

In FIG. 20, a grinding process is performed from a bottom surface of the semiconductor device 110C to remove a bottom portion 102 such that the edge region 105 of the semiconductor device 110C is completely removed after the thermal process. Consequently, the lateral bump structure 121C on the lateral conductive contact pad 105C can contact a contact pad of an adjacent device and implements a lateral signal path of the semiconductor device 110C and the adjacent device, while the vertical bump structure 123A on the vertical conductive contact pads 1032C implements a vertical signal path of the semiconductor device 110C.

Figure 21:
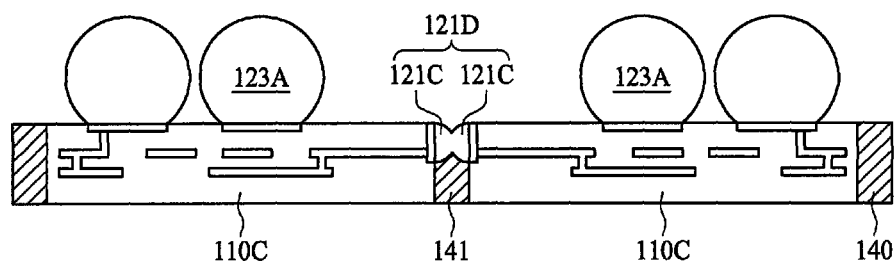

Referring to FIG. 21, in some embodiments, after finishing the semiconductor device 110C shown in FIG. 20, two semiconductor devices 110C are laterally disposed and adjacent to one another, and a molding member 140 is then formed to encapsulate the two semiconductor devices 110C. In alternative embodiments, the two semiconductor devices can be the semiconductor device 110B in FIG. 15 or the semiconductor device 110A in FIG. 10. Subsequently, a thermal treating process such as an infrared (IR) reflow process is performed to form a lateral bump structure 121D implementing a lateral signal path between the two semiconductor devices 110C. In some embodiments, the lateral bump structure 121D extends laterally across an intervening portion 141 of the molding member 100 to implement a lateral signal path between the two laterally adjacent semiconductor devices 110C.

The lateral extension of the lateral bump structure from the side of the semiconductor device can contact a corresponding conductor of a laterally adjacent device to implement a lateral signal path between the semiconductor device and the laterally adjacent device in the absence of a redistribution structure corresponding to the redistribution layer.

The embodiments of the present disclosure provide a semiconductor package with a lateral bump structure implementing the lateral signal path between the two laterally adjacent semiconductor devices in the absence of a redistribution structure. Consequently, the height of the semiconductor package of the present disclosure is less than the height of the semiconductor package with a redistribution structure. In other words, the semiconductor package of the present disclosure can meet the miniaturized scale demand (small form factor) of the semiconductor packages. In addition, the absence of the redistribution structure is a key factor in the reduction of the fabrication cost of the semiconductor package.

One embodiment of the present disclosure provides a semiconductor package that includes a semiconductor device having an upper surface and a side, wherein the upper surface and the side form a corner of the semiconductor device. The semiconductor package also includes a lateral bump structure disposed on the side and implementing a lateral signal path of the semiconductor device. The semiconductor package further includes a vertical bump structure disposed over the upper surface and implementing a vertical signal path of the semiconductor device.

Another embodiment of the present disclosure provides a semiconductor package including a first semiconductor device, a second semiconductor device laterally adjacent to the first semiconductor device, and a lateral bump structure extending from the first side to the second side and implementing a lateral signal path between the first semiconductor device and the second semiconductor device. The first semiconductor device has a first upper surface and a first side, wherein the first upper surface and the first side form a first corner of the first semiconductor device. The second semiconductor device has a second upper surface and a second side, and the second upper surface and the second side form a second corner of the second semiconductor device. The semiconductor package further includes a first vertical bump structure disposed over the first upper surface, and a second vertical bump structure disposed over the second upper surface.

Another embodiment of the present disclosure provides a method for preparing a semiconductor package including: providing a semiconductor device having a bulk region and an edge region adjacent to the bulk region; forming a depression in the edge region, wherein the depression exposes a side of the bulk region; and forming a lateral bump structure in the depression, wherein the lateral bump structure is formed on the side and implements a lateral signal path of the semiconductor device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor package, comprising:
a semiconductor device having an upper surface and a side, wherein the upper surface and the side form a corner of the semiconductor device;
a lateral bump structure entirely disposed on the side and implementing a lateral signal path of the semiconductor device; and
a vertical bump structure, separated from the lateral bump structure, disposed entirely over the upper surface.

2. The semiconductor package of claim 1, wherein the vertical bump structure implements a vertical signal path of the semiconductor device.

3. The semiconductor package of claim 1, wherein the lateral bump structure extends laterally from the side.

4. The semiconductor package of claim 1, wherein the vertical bump structure extends vertically from the upper surface.

5. The semiconductor package of claim 1, further comprising a contact pad disposed between the side and the lateral bump structure.

6. A semiconductor package, comprising:
a first semiconductor device having a first upper surface and a first side, wherein the first upper surface and the first side form a first corner of the first semiconductor device; and
a second semiconductor device laterally adjacent to the first semiconductor device, wherein the second semiconductor device comprises a second upper surface and a second side, and the second upper surface and the second side form a second corner of the second semiconductor device;
a lateral bump structure extending from the first side to the second side and implementing a lateral signal path between the first semiconductor device and the second semiconductor device,
a first vertical bump structure disposed entirely over the first upper surface,
wherein the first vertical bump structure is separated from the lateral bump structure.

7. The semiconductor package of claim 6, further comprising:
a molding member surrounding the first semiconductor device and the second semiconductor device, wherein an intervening portion of the molding member is disposed between the first semiconductor device and the second semiconductor device;
wherein the lateral bump structure extends laterally across the intervening portion.

8. The semiconductor package of claim 6, further comprising a second vertical bump structure disposed over the second upper surface, wherein the second vertical bump structure is separated from the lateral bump structure.

9. The semiconductor package of claim 6, wherein the lateral bump structure extends vertically across the first upper surface and the second upper surface.

10. The semiconductor package of claim 6, further comprising a contact pad disposed between the first side and the lateral bump structure.

* * * * *